United States Patent [19]

Simko

[11] Patent Number: 4,488,060

[45] Date of Patent: Dec. 11, 1984

[54] HIGH VOLTAGE RAMP RATE CONTROL SYSTEMS

[75] Inventor: Richard T. Simko, Los Altos, Calif.

[73] Assignee: Xicor, Inc., Milpitas, Calif.

[21] Appl. No.: 382,767

[22] Filed: May 27, 1982

Related U.S. Application Data

[63] Continuation-in-part of Ser. No. 230,683, Feb. 2, 1981, , Ser. No. 6,026, Jan. 24, 1979, Pat. No. 4,314,265, and Ser. No. 6,030, Jan. 24, 1979, Pat. No. 4,274,012.

[51] Int. Cl.³ .................... H03K 5/08; H03K 5/12; H03K 6/04
[52] U.S. Cl. .................... 307/263; 307/228; 307/548; 307/550; 307/568
[58] Field of Search .............. 307/263, 228, 540, 547, 307/548, 549, 550, 568

[56] References Cited

U.S. PATENT DOCUMENTS

| | | |
|---|---|---|
| 3,558,927 | 1/1971 | Whitehouse ................ 307/549 |
| 3,621,284 | 11/1971 | Cluett et al. ................ 307/568 |
| 3,818,244 | 6/1974 | Dolby et al. ................ 307/550 |
| 3,835,401 | 9/1974 | Tomita et al. ................ 307/547 |
| 4,263,664 | 4/1981 | Owen et al. . |
| 4,274,012 | 6/1981 | Simko . |
| 4,300,212 | 11/1981 | Simko . |
| 4,314,265 | 2/1982 | Simko . |
| 4,326,134 | 4/1982 | Owen et al. . |

Primary Examiner—John Zazworsky
Attorney, Agent, or Firm—Fitch, Even, Tabin & Flannery

[57] ABSTRACT

Integrated circuit high voltage ramp rate control methods and devices which provide a controllable ramp rate action. The systems are particularly useful for "on-chip" EEPROM high voltage power supplies.

12 Claims, 3 Drawing Figures

HIGH VOLTAGE RAMP RATE CONTROL SYSTEMS

This application is a continuation-in-part of application Ser. No. 230,683 filed Feb. 2, 1981, and application Ser. Nos. 6,026 and 6,030 both filed Jan. 24, 1979, now U.S. Pat. Nos. 4,314,265 and 4,274,012, which are incorporated by reference herein.

The present invention relates generally to the field of integrated circuit high voltage control systems, and more particularly, relates to such methods and circuits for controlling the ramp rate of high voltage power supplies such as integrated circuit high voltage generators. Methods and circuitry in accordance with the present invention find particular utility in connection with integrated circuits such as nonvolatile programmable random access memory devices (EEPROM's) which utilize "on-chip" generated high voltage power supplies.

In this regard, nonvolatile memory elements and arrays such as described in U.S. Pat. Nos. 4,274,012, 4,300,212 and 4,314,265 have been provided which utilize relatively high voltages for programming and erasing of nonvolatile memory elements, and integrated circuit memory systems have been developed which utilize on-chip generation of the high programming and erasing voltages, such as described in U.S. Pat. No. 4,263,664 and U.S. Pat. No. 4,326,134 entitled "Integrated Rise-Time Regulated Voltage Generator Systems", which are incorporated herein by reference.

It would be useful in the design of such circuits as EEPROM memories which operate with a relatively low voltage (e.g., 5 volts) external power supply but which generate high internal voltages for on-chip functions such as programming and erasing of nonvolatile memory cells, to have high voltage ramp rate control systems with low power consumption and readily controllable ramping characteristics. In addition, because on-chip high voltage generators have quite limited current output capability (e.g., typically about 10 microamperes), it is desirable that a ramp rate control circuit not draw current except when it is desired that control of the ramp rate be carried out. In integrated circuits utilizing on-chip substrate bias generators, it is also desirable that ramp rate control circuits and methods be provided which do not transmit substantial current to the semiconductive substrate as an additional load to the substrate bias generator.

In the design of 5 volt only type EEPROM memory circuits and similar circuitry utilizing permanent or semipermanent charge storage techniques, it is desirable to control the ramp rate of internal high voltages to particular values which are most effective in the operation of the memory cell or other charge storage elements, as for example, ramp rates characterized by potential increase in the range of 10–50 volts per millisecond. However, such millisecond time constants are substantially (e.g., a thousand times) longer than "natural" internal time constants of contemporary integrated circuits, and there are difficulties in providing such ramp control without resort to external resistors and/or capacitors. In addition, because the ramp rate of an integrated high voltage generator output is a direct function of its output current capability, and an inverse function of the generator load, if the load varies as it may in integrated circuit memory devices, such load variation will affect the ramp rate if the current output is not changed in a compensating manner.

Accordingly, it is an object of the present invention to provide integrated circuit methods and apparatus for controlling the ramp rate of on-chip high voltage generators.

It is a further object of the present invention to provide integrated circuit high voltage generator systems in which the generator ramp rate is controlled.

It is yet another object of the present invention to provide high voltage generator ramp rate control method and apparatus wherein such control is maintained notwithstanding a widely varying capacitive load on the generator.

These and other objects will become apparent from the following detailed description and accompanying drawings, of which:

Figure 1:
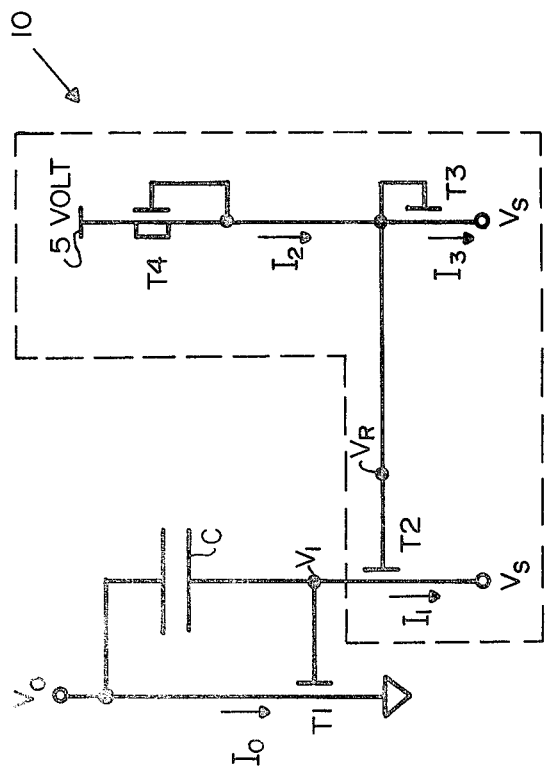
FIG. 1 is a schematic circuit diagram of an embodiment of an integrated ramp control circuit in accordance with the present invention.

Generally in accordance with the present invention, methods and integrated circuit devices are provided for controlling the ramp rate of an integrated circuit high voltage current source such as an integrated circuit high voltage generator so that the rate of increase of potential of the high voltage source does not exceed a predetermined value. Also in accordance with the present invention, integrated circuit high voltage power supply systems which utilize such methods and apparatus are also provided.

In accordance with various preferred device aspects of the present invention, integrated high voltage ramp rate control circuitry is provided in which the conductivity of a current regulating clamping transistor is adjusted by means of controlled capacitive coupling feedback with the high voltage source which is to be provided with a regulated ramp rate.

Such integrated ramp rate control circuitry may comprise high potential input means for making electrical connection in respect to its ramp rate, grounding means for making electrical connection with a reference potential current sink, and ramp rate clamping current control means responsive to a ramp rate control potential for regulating the flow of current between the high potential input means and the grounding means to control the rate of increase of potential of the high potential input means and thereby the high voltage power supply. The ramp rate current control means may desirably comprise one or more MOS (metal oxide semiconductor) transistors, the conductivity of which is regulated by a control potential applied to the gate thereof. The power supply subjected to such ramp rate control will desirably be an integrated circuit high voltage generator means for generating a high voltage of up to about 50 volts at a limited current output capability in the range of from about 0.1 to about 100 microamperes, and more typically in the range of from about 1 to about 15 microamperes. The ramp rate current control transistor means should best have a controllable conductivity range which ranges from a substantially completely preventing current flow to the grounding reference sink (i.e., less than 5 percent and preferaly less than 1 percent of the current output capability of the generator), to a conductivity which is adequate to conduct any excess of the limited current output of the high voltage generator means to the grounding reference sink, which is greater than the desired ratio of the generator output to the generator load, exclusive of the ramp rate control currents. Desirably, the current sinking capability may range from about one nanoamp ($10^{-9}$ Amp) in an "off" state to about 100 microamps ($100 \times 10^{-6}$ Amp) in an operationally saturated current state.

The integrated circuitry may further comprise means for providing a ramp rate control potential to the current control means comprising a control potential node coupled to the gate of said ramp rate current control transistor, and comprising capacitive coupling means for capacitively coupling said control potential node to the high potential input means such that the control node is charged as a function of the rate of charge of potential of the high voltage input means. The circuitry may further comprise control node discharge means for controlling the flow of current between the control potential node and a reference potential source. Through the use of the control node discharge means, the potential of the control node may be provided as a function of the rate of charging produced by the capacitor means minus the rate of discharging produced by the control node discharge means. Desirably, the capacitive coupling means will be an integrated circuit capacitor having a capacitance in the range of from about 0.02 to about 10 picofarads, which will be determined in part, as will be more fully discussed hereinafter, by the desired maximum ramp rate of the circuit. One plate of said capacitor makes electrical connection to the high potential input means, and the other plate of which makes electrical connection to the gate of the MOS clamp current regulating transistor via said control potential node.

The control node discharge means for controlling the current flow between the control potential node and a reference potential source is an important feature of various device aspects of the present invention, by means of which (in combination with the capacitance of the capacitor means) the ramp rate may be selected. The control node discharge means may desirably comprise one or more MOS transistors by means of which a capacitively coupled potential developed at the control node as a function of the rate of increase of the potential at the high voltage input means may be controllably discharged. In this manner, the control node potential is derived from the net effect of the charging provided by the capacitor means and discharging provided by the current node discharge control means. Desirably, the control node discharge means will comprise means for discharging the control node at a predetermined discharge rate, which will generally correspond to the capacitive charging rate of the control node when the input means is rising in potential at the desired ramp rate. In this manner, the control node may be discharged at a rate which controls the maximum ramp rate of the potential appearing at the high voltage input means.

The methods and apparatus according to the present invention are particularly useful in integrated circuit combination with high voltage generators, which generate a rising relatively high potential when activated, and which have a peak potential of up to about 50 volts and a limited current output capability in the range of from about 0.1 to about 100 microamperes.

As indicated, in accordance with various system aspects of the present invention, high voltage power supply systems utilizing such integrated ramp rate control circuitry may be provided which further comprises generator means for providing a high voltage signal having a maximum potential of at least 10 volts and preferably in the range of from about 15 to about 40 volts, means for capacitively coupling the output potential of the generator means to a control node such that the control node is increased in potential as a result of increasing generator output potential, means for regulating the conduction of output current from the generator means to a current sink in response to the control node potential, and means for regulating the conduction of current between said control node and a reference potential sink to thereby control the ramp rate of the generator.

In accordance with additional aspects of the present invention, a method is provided for controlling the ramp rate of a high voltage signal source in an integrated circuit so that it neither rises at a rate exceeding a predetermined ramp rate nor at a rate below a predetermined ramp rate. In accordance with various aspects of such method, a high voltage signal source potential such as that generated by a high voltage integrated circuit generator, is capacitively coupled to a ramp current control node, such that the charging rate of the control node (and hence its potential) is a function of the rate of change of the signal source potential. The method further contemplates discharging the control node at a rate which is a function of the desired ramp rate for the high voltage signal source, such that the rate of change of the control node potential is proportional to the net of the charging and discharging currents thereof. In this regard, if the charging rate exceeds the discharging rate, the control node potential increases; if the charging rate equals the discharging rate, the control node potential remains substantially constant; and if the discharging rate exceeds the charging rate, the control node potential decreases. The method further comprises regulating the conduction of current between the high voltage signal source and a current sink as a predetermined function of the potential difference between the control node and a reference potential, such as the potential of the current sink which may desirably be ground potential. Because such current limits the rate of potential rise of the signal source, which in turn affects the rate of capacitive charging of the control node, a negative feedback mechanism is provided to restrict the ramp rate of the high voltage signal source to a rate controlled by the discharge rate of the control node. By thus regulating the conduction of current from the capacitively coupled control node to a reference potential sink, the rate of increase of the high voltage signal may be controlled so that it does not exceed a preselected value which depends on the capacitive coupling and the current flow from the control node.

Further in accordance with the present invention, an integrated circuit high voltage generating method may be provided comprising the steps of initiating the generation of a high voltage signal to provide an output signal of increasing potential, capacitively charging a control node as a function of the output signal, discharging the control node in a regulated manner such that its rate of discharge is a function of the desired ramp rate, and conducting the output signal to a grounding sink as a function of the control node potential such that the output signal does not rise in potential at a rate which substantially exceeds the desired ramp rate. The control node discharge current, which together with the charging rate regulates the control node potential, may be in turn regulated by means of a proportioning current repeater or current mirror circuit, in which control node discharge current is a bias current proportional to a larger bias control current.

In accordance with various aspects of the present invention, integrated circuit high voltage generators having a regulated ramp rate in the range of from about 30 volts per 0.1 millisecond to about 30 volts per 10 milliseconds and preferably in the range of from about 30 volts per millisecond to about 30 volts per 3 milliseconds for contemporary EEPROM memory applications, may be provided.

Figure 3:
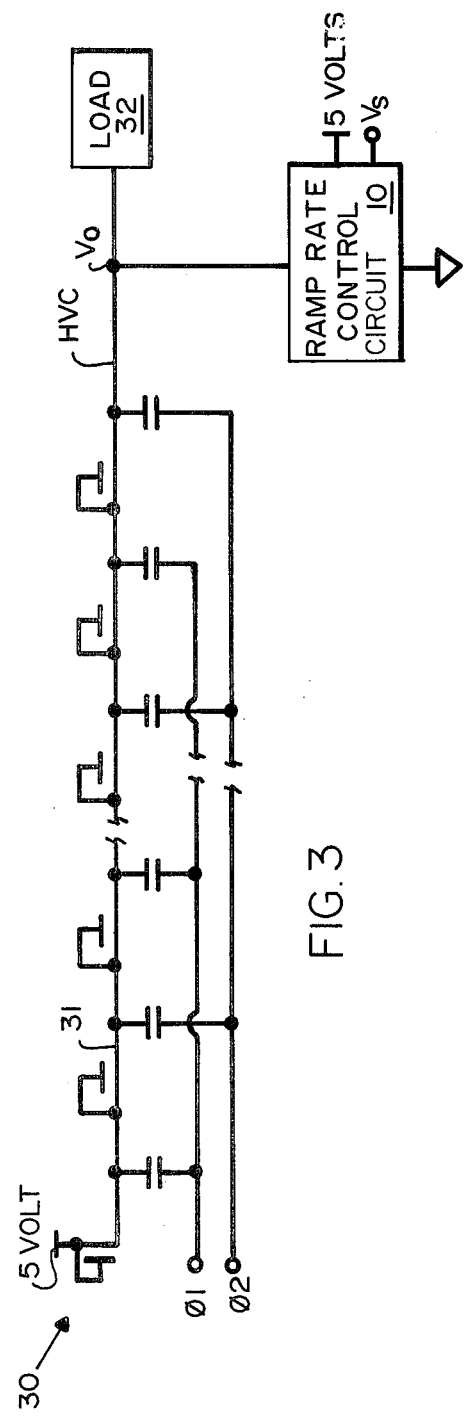
FIG. 3 is a circuit diagram of an integrated circuit high voltage charge pump of a type suitable for use with the ramp rate control circuit of FIG. 1.
Figure 2:
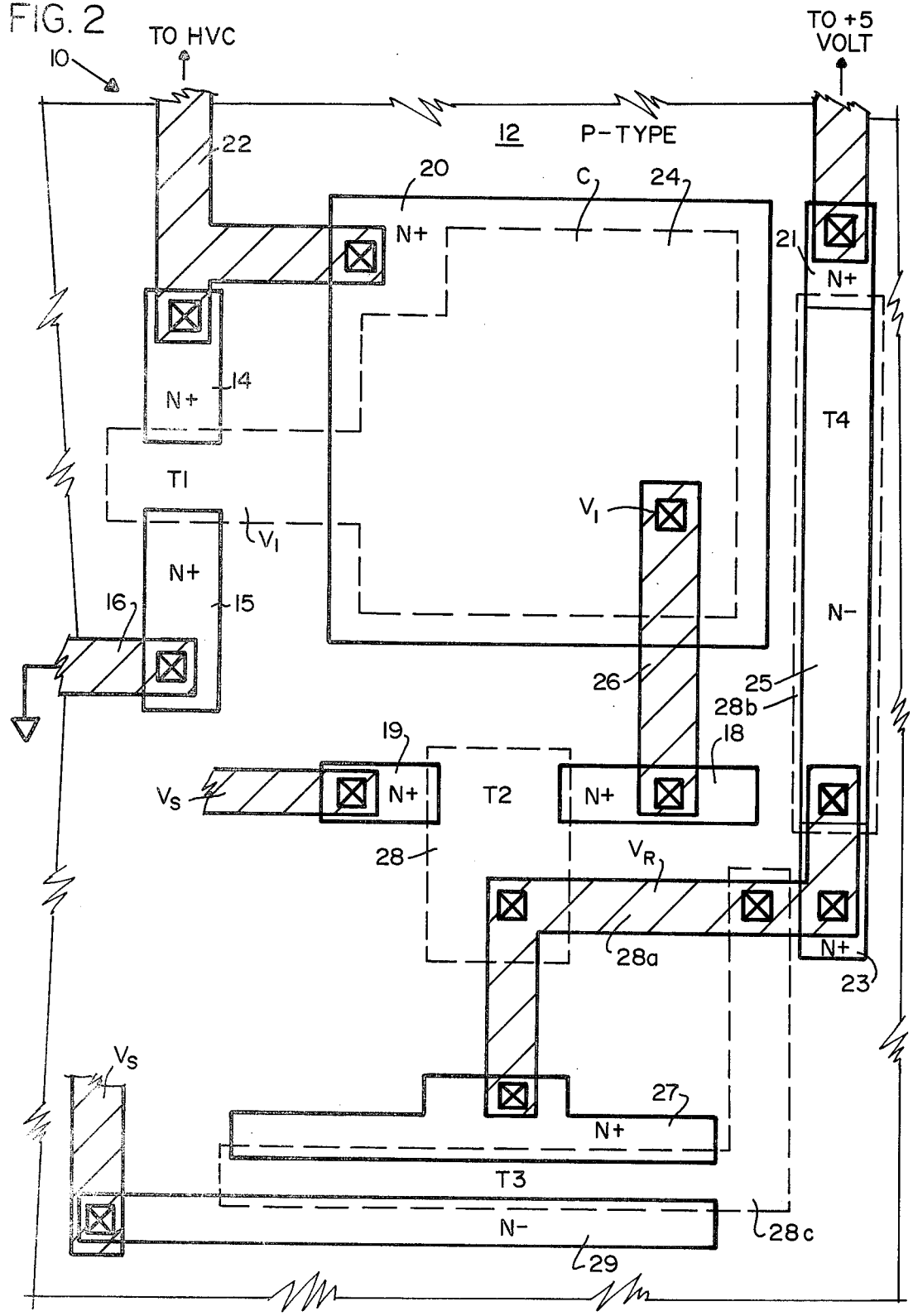
FIG. 2 is a top view of an integrated circuit layout for the high voltage ramp control circuit of FIG. 1.

Having generally described various methods and device aspects of the present invention, particular features of the invention will now be more particularly described with respect to the specific embodiments illustrated in FIGS. 1-3 of the drawings.

Illustrated in FIG. 1 is an embodiment 10 of an integrated high voltage ramp rate control circuit which is adapted to control the rate of increase of the potential of a high voltage input node Vo at a rate determined by the circuit 10. As illustrated in FIG. 3, the node Vo of the ramp control circuit 10 may be connected to the output line of a high voltage generator 30, which when activated provides a rising output potential. Generator 30 is a charge pump circuit including a conventional charge pump 31. In the absence of the circuit 10 this rising output potential would rise at a rate determined by the current output capability of the charge pump 31 and the load 32 on the generator 30. For applications such as programming nonvolatile memory cells, it is desirable that the high voltage generator output rise at an optimum rate for cell operation, which rate will depend on the type of memory cells and, to some degree, on the amount of use of the cells, but which typically may be in the range of from about 30 volts/millisecond to about 30 volts/3 millisecond. It will be appreciated that the impedance of the load 32 on the generator 30 (which may be primarily a capacitive load) may vary, depending on operating conditions, but that it is nevertheless desired that a regulated ramp rate be provided to the high voltage output signal HVC.

Referring again to FIG. 1, the ramp rate control is carried out by regulating the conduction of clamping current from node Vo to ground potential by means of an MOS transistor T1, the gate potential of which is capacitively coupled to high voltage node Vo through a capacitor C, and regulated by transistor T2, which similarly drains to a reference potential node Vs of the circuit. The reference potential Vs may be a fixed potential such as ground potential or a substrate bias potential at for example −2 to −4 volts. For ramp rate control of a high voltage signal of increasing potential, this bias potential will be a relatively low potential in respect to the potential range of high voltage output signal HVC.

The regulation of the gate potential (at node V1 of the device 10) of the enhancement type ramp rate control transistor T1 is controlled by an appropriate regulation potential applied to the gate of regulation transistor T2, at node VR. The ground sink for transistor T1 will desirably be a grounding line directly connected to a ground pin of the integrated circuit, so that substrate bias potential generators will not be loaded with the ramp rate limiting current. When an increasing potential is applied to high voltage input node Vo, this will effect capacitive charging and a consequent rise in potential of control node V1 because node V1 is capacitively coupled to node Vo by capacitor C. If the potential of node V1 rises above the conduction threshold of the enhancement type transistor T1, a clamping current Io will be conducted through transistor T1 to ground, thereby limiting further increase of potential of node Vo and the generator 30 connected thereto. However, in the illustrated embodiment 10, the node V1 is discharged by a discharge current I1 which is controlled in proportion to a bias current I2 conducted from the regulated chip 5 volt supply through depletion transistor T4 and an enhancement transistor T3 to reference potential Vs. Enhancement transistors T2 and T3 have matched threshold potential VR and matched conduction threshold, so that transistors T2, T3 and T4 form a current repeater circuit in which the current I1 is proportional to the currents I2 and I3 conducted through transistors T4 and T3. Desirably, the current I1 will be less than about 5 percent, and preferably less than about 3 percent, of the current I3.

Illustrated in FIG. 2 is a top view, broken away from other components of the integrated circuit chip, of an integrated circuit layout for the high voltage ramp rate control circuit 10 shown schematically in FIG. 1, in which various layers of the device are shown transparently in overlying relationship. The device components, like other integrated circuit components of the ramp rate controlled power supply system 30 of FIG. 3 and an overall integrated circuit system which utilizes the power supply output, may be fabricated on a p-type monocrystalline silicon substrate 12 in accordance with known n-channel MOS fabrication techniques, and is adapted to utilize a 5 volt external power supply.

In the illustrated device 10, N+ regions in the p-type substrate 12 form source/drain regions 14, 15. An intervening region covered by a thin dielectric oxide layer forms enhancement type high voltage regulating transistor T1. Similarly, an N+ region forms source/drain region 18 in the p-type substrate 12, which together with N+ region 19 and the intervening thin oxide portion of the p-type substrate form MOS enhancement type transistor T2.

An N+ implant region 20 forms one plate of the capacitor C, and both the drain 14 and the capacitor plate zone 20 make electrical connection through the overlying dielectric oxide layer by means of overlying metal (e.g., aluminum) line 22 which also forms high voltage node Vo. Node Vo in turn connects with the high voltage power supply signal HVC from the generator 30, the output of which is to be controlled by the circuit 10. The other plate of the capacitor C is formed by a dielectrically isolated polysilicon electrode 24 overlying the n-type zone 20.

An extension of the polysilicon electrode 24 overlies the enhancement zone between drain and source 14, 15 to form the gate of transistor T1. The polysilicon electrode 24 of capacitor C makes electrical connection as shown in FIG. 2 through the intermediate dielectric oxide to a metal (e.g., aluminum) electrode 26 which in turn is connected to drain 18 of transistor T2.

It can thus be seen that in this embodiment, node V1 is formed by electrode 24 and its connection both to the gate of transistor T1 and to region 18 of transistor T2. The gate of transistor T2 may be formed by dielectrically isolated polysilicon region 28 which is maintained at VR, the ramp control potential. Source 15 of transistor T1 makes appropriate respective electrical connection to metallic or polysilicon ground potential terminal electrode 16 through the overlying oxide dielectric. Source 19 of transistor T2 makes appropriate connection to reference potential Vs in a similar manner.

The illustrated bias current depletion transistor T4 is formed by N+ source/drain zones 21, 23 and intermediate N− zone 25. The overlying gate electrode 28b of transistor T4 as well as N+ region 23 is connected to dielectrically isolated electrode 28a. Similarly, the enhancement transistor T3 of the bias current regulator circuit is formed by N+ source/drain zones 27, 29 which also has an electrically isolated gate 28c connected to electrode 28a. The drain region 21 of transistor T4 makes appropriate connection to a 5 volt power supply. The drain region 27 of transistor T3 also is coupled to electrode 28a. The source 29 of transistor T3 connects with the voltage reference Vs.

In the illustrated embodiment 10, the transistors T1, T2 and T3 are preferably n-channel MOS type enhancement transistors having a threshold potential Vt of about 1 volt (e.g., 0.8 volts), and the transistor T4 is a depletion transistor. Typical sizes of the illustrated transistors T1 and T2 are represented by a Z/L ratio (width to length) of 10 microns/10 microns. The capacitance of capacitor C may vary widely, typically from 0.01 picofarads to 5 or more picofarads, depending on the capacitive coupling desired.

The bias current depletion transistor T4 may have a Z/L ratio of for example 6 microns/200 microns to provide a relatively long depletion channel and a correspondingly relatively limited current I2 therethrough of about two microamperes. Current I2 is necessarily conducted through enhancement transistor T3 as current I3 to source Vs. The enhancement transistor T3 has a relatively large Z/L ratio of 200 microns/10 microns as compared to the Z/L ratio of the transistor T2, such that the conductivity of transistor T3 is approximately 20 times greater than the conductivity of transistor T2. The illustrated enhancement transistors T2 and T3 have substantially matched threshold Vt values (e.g., within plus or minus 20 millivolts), such that the currents conducted therethrough at a given gate potential VR established by the T3-T4 transistor pair will be approximately proportional to their conductivity ratio under operating conditions.

In accordance with the present invention, the ramp rate limit may be varied depending on performance parameters of the circuit other than those described above and/or other timing parameters. For example, the ramp rate may be adjusted to a predetermined value which itself may be varied. Generally, however, it is desirable that the ramp rate be set at a relatively constant straight-line value.

Having generally described the device 10 of FIGS. 1 and 2, its operation will now be described in more detail with respect to the high voltage generator system illustrated in FIG. 3, which incorporates a ramp rate control circuit 10 as shown in FIGS. 1 and 2.

In the high voltage generator system 30 of FIG. 3, charge pump 31 generates a low current output voltage signal HVC that increases to a predetermined high voltage level of from 10–50 volts. This voltage signal is intended to be used, for example, in writing and erasing nonvolatile memory elements of a memory array.

The charge pump 31 may be driven by non-overlapping two phase clock signals $\phi 1$, $\phi 2$, which may be provided by any suitable two phase clock generator, such as described in U.S. Pat. No. 4,263,664, and the above referred to U.S. Pat. No. 4,326,134. The amplitude of these clock signals may be varied approximately between 0 and 5 volts peak-to-peak, and operate at a frequency of several megahertz. The illustrated transistors in charge pump 31 are enhancement type transistors. Operation of charge pump circuit 30 containing, for example, 20 stages may provide an output potential of up to about 50 volts, with a peak current capability in the range of from 1 microampere to about 10 microamperes. Upon starting the generator by applying clock signals thereto, it will produce a steadily rising output signal at output node HVC, which, in the absence of the control circuit 10, will rise at a rate determined by the charge pump capacity and output load 32. In an EEPROM device, load 32 is largely a capacitive load. However, this ramp rate is controlled in the system 30 so that it does not exceed a desired value. The output will desirably rise at a nominal rate of 10–40 volts per millisecond in the illustrated embodiment, but other ramp rates may be desirable for different applications. It will be appreciated that integrated circuit charge pumps and ramp control circuits may readily be made larger or smaller in size and ramp rate. It will further be appreciated that relatively high voltages (e.g., from 25 to 50 volts) can be readily generated from relatively low-voltage clock signals (e.g., 5 volts or less).

Turning to FIG. 1, it can be seen that ramp rate control transistor T1 has a conductivity which is modulated by a feedback circuit wherein the ramping voltage is fed back through capacitor C to the gate of transistor T1. It will also be appreciated that in the absence of any conduction through transistor T2, as the potential of node Vo is raised by the generator pump 31, the capacitor C translates the voltage of node Vo onto node V1 and thereby onto the gate of transistor T1. If the gate of transistor T1 is thereby raised to a potential level near its gate threshold Vt or slightly higher, then transistor T1 becomes conductive. At this point, all of the current that the generator could supply would be transmitted through transistor T1 to ground, and the node Vo would be clamped without permitting any further potential increase.

The function of transistor T2 is to control the discharge rate of capacitor C by means of current I1 and thereby provide an effectively controlled voltage level at node V1, thus enabling transistor T1 to be turned on and conductive only a controlled amount. That is, current I1 enables a potential difference to be developed across capacitor C as a function of the desired ramp rate. If Vo goes up faster than the desired ramp rate, V1 goes above the turn-on threshold of T1, since I1 is not large enough to hold V1 down. This causes T1 to turn on and conduct a greater Io from the charge pump 31 thereby causing Vo to slow its rate of rising voltage. If Vo is rising slower than the desired ramp rate, I1 will dominate over V1 causing V1 to fall in voltage below the turn on threshold of T1, thereby turning off T1 and removing any current drain Io from the charge pump 31. This enables Vo to rise at a faster rate. In other words, as generator 31 begins operating and the potential of node Vo rises, a displacement current $I1 = C\, dVo/dt$, where C is the capacitance of capacitor C, is developed across transistor T2. The value of dVo/dt is the ramp rate of the node Vo. If control voltage VR is near the pre-threshold conduction range of transistor T2 with respect to the reference potential Vs, displacement current I1 will be sufficiently small to allow node V1 to rise slightly above the threshold of transistor T1. At this point, transistor T1 will conduct the generator current sufficiently to slow the potential rise of Vo such that the ramp rate of Vo corresponds to the desired ramp rate. Because the generator 31 has a relatively small output current capability, such as about 10 microamperes, the current capacity of transistor T1 is adequate to control its ramp rate. Note also that the maximum current Io is near the limit of the high voltage generator output capability.

The desired ramp rate is determined by simply selecting the value of C and the discharge controlling potential VR, which determines I1. An important advantage of this circuit is that while node Vo and associated generator 31 may see widely varying capacitive charging type loads, the circuit 10 will still maintain a fixed ramp rate. Of course, if the capacitive load is very great, the ramp controller current Io will go to zero and the ramp will be "slow" as determined by this load and the maximum current output of the Vo generator.

The potential difference between the gate of current regulating transistor T2 and the reference potential Vs may be in the range of 0.2 to 1.0 volts in the illustrated embodiment, as determined by a bias current reference circuit comprising transistors T3 and T4. Depending on this reference circuit, VR and Vs may be slightly above or a few volts below ground potential. The displacement current I1 can be set in the 1 to 100 nanoampere current range, depending on the desired ramp rate. Note that since T3 is arranged with respect to reference potential Vs in the same way as T2, the potential difference with respect to its gate will also be in the range of 0.2 to 1.0 volts.

The ramp rate control circuit has the very significant advantages that it has a sufficiently small area that it can be integrated on to a typical integrated circuit, while being able to handle relatively high voltages and to control very slow ramp rates.

In the illustrated embodiment, a means is provided for drawing a precisely controlled current I1 from the gate of the transistor T1. The value of this current corresponds to C dVo/dT, which is the capacitance value of the capacitor C times the ramp rate of the node Vo. If the current I1 is increased, then the ramp rate dV/dT of node Vo can proceed to faster ramp rates and if the discharge current I1 is very low, it will force the node Vo to have a very slowly rising ramp rate. As mentioned above, with I1 increased, V1 is lower which holds off T1. This allows Vo to rise faster. With I1 reduced, however, V1 goes up, causing T1 to turn on harder. This enables more current Io to sink through T1, thereby slowing the rise of Vo.

Accordingly, the illustrated circuit 10 provides a means for controlling a transistor so that it conducts current away from the high potential node Vo as a function of the increasing potential difference across a feedback capacitor minus the rate of capacitor discharging as a result of a controlled current. The discharge of the capacitor C can be regulated by a very small controllable current in the range of 1 to 100 nanoamperes. In the circuit 10, the discharge current path from the capacitor C is implemented by a MOS transistor T2, which is part of a bias current control circuit comprising a depletion pullup transistor T4 and an enhancement pulldown transistor T3 tied thereto, together with the discharge transistor T2 itself.

The bias discharge current control circuit is substantially independent of the absolute value of threshold of the current-conducting transistor T2 which conducts the weak discharge current I1. Transistors T2 and T3 are the same type having substantially matched thresholds (i.e., within 20 millivolts), as previously indicated, so that they similarly respond to the control potential VR.

The depletion transistor T4 is a referencing element which provides about two microamperes of current, which is sunk by transistor T3, to generate voltage reference VR. Transistor T2 has a conductivity which is significantly less than that of transistor T3, thereby dividing down considerably the amount of current conducted by transistor T2 in predetermined ratio to the reference current in transistor T4. Current I1 may be by example 20 or more times smaller than the current in transistor T4 so that a small reproducible current can be generated, which is independent of the absolute value of the T2, T3 transistor combination. When the current is applied to the capacitor C, transistor T1 combination to establish a control potential for transistor T1, it provides a very small layout area ramp rate controller for the high voltage node Vo.

The illustrated embodiment provides a relatively precise ramp rate controller which varies substantially only with variation of the current in transistor T4, which is controllable by normal processes to, for example, plus or minus 30%. If the high voltage-low current generator seeks to charge node Vo and its load 32 at a much faster rate than the desired ramp rate, node V1, the gate of transistor T1, will increase its voltage slightly and thereby sink more current to compensate for the extra current charging to maintain a stable ramp rate. However, if generator has a relatively large load applied externally of the ramp rate controller, which generator cannot supply at the desired ramp rate, then the ramp rate controller current Io quickly drops to substantially zero, to permit the generator to drive this external load at its maximum capability.

Because capacitive loads presented to high voltage generators in circuits such as EEPROM circuits may vary over a very large range, such as by a factor of 100, and because it is desirable to have the same ramp rate whether the load is large or small, circuits and methods in accordance with the present invention find substantial utility in such integrated circuits.

Accordingly, it will be appreciated that in accordance with the present invention, integrated circuit high voltage ramp rate control systems have been provided which have particular utility in the provision of high voltage on-chip power supplies such as employed in 5 volt only n-channel MOS EEPROM circuits. However, while various aspects of the present invention have been described with particular reference to a specific n-channel MOS technology embodiment and utilization, it will be appreciated that various further uses, modifications and adaptations will become apparent based on the present disclosure, and are intended to be within the spirit and scope of the present invention.

In this regard, it will be appreciated, for example, that devices and methods in accordance with the invention may be provided with various integrated circuit technologies in addition to n-channel MOS technology, such as p-channel MOS (including CMOS/SOS) and it will be appreciated that the potential values may be regarded as the absolute value of the difference from a reference potential which will typically be ground potential.

Various of the features of the present invention are set forth in the following claims.

What is claimed is:

1. An integrated circuit for controlling the ramp rate of a high voltage generator comprising high potential input means for making electrical connection with said high voltage generator; grounding means for making electrical connection with a reference potential current sink; a control potential node; ramp rate current control means responsive to a control potential at said control potential node for regulating the flow of current between the high potential input means and the grounding means; capacitive coupling means for capacitively coupling said control potential node to the high potential input means; a reference potential node; and control potential node discharge means for controlling current flow between the control potential node and the reference potential node.

2. An integrated circuit high voltage ramp rate control circuit in accordance with claim 1 wherein the ramp rate current control means comprises an MOS transistor including a gate, a source and a drain, said control potential node being coupled to said gate, such that the conductivity of said transistor is regulated by the control potential of said control potential node.

3. An integrated circuit high voltage ramp rate control circuit in accordance with claim 2 wherein the conductivity of said MOS transistor may range from about one nanoampere in an off state to about 100 microamperes in a saturated current state.

4. An integrated circuit high voltage ramp rate control circuit in accordance with claim 2 wherein said capacitive coupling means comprises one or more integrated circuit capacitors having a capacitance in the range of from about 0.02 to about 10 picofarads, and wherein said control node discharge means comprises at least one MOS transistor together with bias current control means for regulating the conduction of said discharge transistor to a current value in the range of from about 1 nanoampere to about 200 nanoamperes to provide a regulated ramp rate in the range of from about 5 to about 100 volts per millisecond.

5. Integrated circuit high voltage ramp rate control circuitry in accordance with claim 4 wherein said bias current control means comprises a MOS depletion pullup transistor and an enhancement MOS pulldown transistor having a gate conductance threshold value substantially the same as the gate conductance threshold of said discharge means transistor.

6. Integrated circuit high voltage ramp rate control circuitry in accordance with claim 5 wherein said bias current control enhancement transistor has a conductivity of approximately 20 times the conductivity of said discharge means transistor.

7. An integrated circuit high voltage ramp rate control circuit in accordance with claim 1 wherein said high voltage generator generates a high voltage of up to about 50 volts at a limited current output capability in the range of from about 0.1 to 100 microamperes.

8. An integrated circuit high voltage power supply having a regulated ramp rate comprising
integrated circuit generator means for providing a high voltage signal having a maximum potential of at least 10 volts and a current output capacity in the range of from about 0.1 to about 100 microamperes; a MOS enhancement transistor for controlling conduction of the generator output current to a reference potential sink in response to a control node potential applied to the gate thereof; an integrated circuit capacitor for capacitively coupling the generator output potential to the control potential node; and discharge control means for discharging the control potential node at a regulated current rate proportional to the regulated ramp rate of the generator circuit.

9. A method for controlling the ramp rate of a high voltage integrated circuit signal source comprising the steps of capacitively coupling the high voltage signal source potential to a ramp current control node; discharging the control node at a rate proportional to the desired ramp rate; and controlling the conduction of regulating current between the high voltage signal source and a current sink in response to the potential of the ramp current control node.

10. A method for controlling the rate of rise in potential of a high voltage-low current charge pump generator comprising the steps of capacitively coupling the increasing potential from said generator to a control node; draining current from said control node at a fixed rate proportional to the desired rate of rise of said generator potential; and controlling the conduction of current between said potential generator and a current sink in response to control node potential.

11. The method of claim 10 wherein the step of controlling the current between said potential generator and a current source comprises the steps of coupling the control node potential to the gate of an MOS transistor; and coupling the potential generator and current sink to respective source and drain terminals of said transistor.

12. An integrated circuit high voltage generating method comprising the steps of initiating the generation of a high voltage signal to provide an output signal of increasing potential; capacitively charging a control node as a function of the output signal; discharging the control node in a regulated manner such that its rate of discharge is a function of the desired ramp rate; and conducting the output signal to a grounding sink as a function of the control node potential such that the output signal does not rise in potential at a rate substantially different from the desired ramp rate.

* * * * *